United States Patent [19]

Jones et al.

[11] Patent Number: 5,221,902
[45] Date of Patent: Jun. 22, 1993

[54] NMR NECK COIL WITH PASSIVE DECOUPLING

[75] Inventors: Randall W. Jones, Mukwonago; Thomas E. Schubert, Waukesha, both of Wis.

[73] Assignee: Medical Advances, Inc., Wauwatosa, Wis.

[21] Appl. No.: 895,481

[22] Filed: Jun. 8, 1992

Related U.S. Application Data

[62] Division of Ser. No. 601,552, Oct. 22, 1990, Pat. No. 5,166,618.

[51] Int. Cl.$^5$ .............................................. G01R 33/20
[52] U.S. Cl. .................................. 324/318; 128/653.5
[58] Field of Search ............... 324/300, 307, 309, 318, 324/322; 128/653.2, 653.5

[56] References Cited

U.S. PATENT DOCUMENTS

| | | | |
|---|---|---|---|
| 4,766,383 | 8/1988 | Fox et al. | 324/318 |
| 4,784,146 | 11/1988 | Mancuso et al. | 128/653 |
| 4,817,612 | 4/1989 | Akins et al. | 128/653 |
| 4,918,388 | 4/1990 | Mehdizadeh et al. | 324/322 |
| 5,045,792 | 9/1991 | Mehdizadeh | 324/318 |

*Primary Examiner*—Michael J. Tokar
*Attorney, Agent, or Firm*—Quarles & Brady

[57] ABSTRACT

A whole volume neck coil for MRI includes an anterior and posterior saddle coil, the latter attached to a base. The anterior coil is held in an open framework, hinged against an extension tower attached to the base. The hinge axis is angled to the medial axis to provide greater entry area for the patient's head and shoulders. The extension tower also provides adjustment of the anterior coil toward and away from the base by means of a sliding carriage attached to the extension tower. The coils are passively decoupled from the RF excitation field by means of back-to-back diodes which insert a "pole" forming network into the coils. A method of calculating the values of the network components is taught that accounts for significant diode junction capacitance.

3 Claims, 5 Drawing Sheets

NMR NECK COIL WITH PASSIVE DECOUPLING

This is a division of application Ser. No. 07/601,552, filed Oct. 22, 1990 now U.S. Pat. No. 5,166,618.

BACKGROUND OF THE INVENTION

1. Field of the Invention

The field of the invention is magnetic resonance imaging (MRI) and in particular local coils for use in receiving MRI signals.

2. Background Art

In MRI, a uniform magnetic field $B_0$ is applied to an imaged object along the z axis of a Cartesian coordinate system, the origin of which is approximately centered within the imaged object. The effect of the magnetic field $B_0$ is to align the object's nuclear spins along the z axis.

In response to a radio frequency (RF) excitation signal of the proper frequency, oriented within the x-y plane, the nuclei precess about the z-axis at their Larmor frequencies according to the following equation:

$$\omega = \gamma B_0$$

where $\omega$ is the Larmor frequency, and $\gamma$ is the gyromagnetic ratio which is constant and a property of the particular nuclei.

Water, because of its relative abundance in biological tissue and the properties of its nuclei, is of principle concern in such imaging. The value of the gyromagnetic ratio $\gamma$ for water is 4.26 kHz/gauss and therefore in a 1.5 Tesla polarizing magnetic field $B_0$ the resonant or Larmor frequency of water is approximately 63.9 MHz.

In a typical imaging sequence, the RF excitation signal is centered at the Larmor frequency $\omega$ and applied to the imaged object at the same time as a magnetic field gradient $G_z$ is applied. The gradient field $G_z$ causes only the nuclei in a slice through the object along a x-y plane to have the resonant frequency $\omega$ and to be excited into resonance.

After the excitation of the nuclei in this slice, magnetic field gradients are applied along the x and y axes. The gradient along the x axis, $G_x$, causes the nuclei to precess at different frequencies depending on their position along the x axis, that is, $G_x$ spatially encodes the precessing nuclei by frequency. The y axis gradient, $G_y$, is incremented through a series of values and encodes y position into the rate of change of phase of the precessing nuclei as a function of gradient amplitude, a process typically referred to as phase encoding.

A weak nuclear magnetic resonance generated by the precessing nuclei may be sensed by the RF coil and recorded as an NMR signal. From this NMR signal, a slice image may be derived according to well known reconstruction techniques. An overview NMR image reconstruction is contained in the book "Magnetic Resonance Imaging, Principles and Applications" by D. N. Kean and M. A. Smith.

The quality of the image produced by MRI techniques is dependent, in part, on the strength of the NMR signal received from the precessing nuclei. For this reason, it is known to use an independent RF receiving coil placed in close proximity to the region of interest of the imaged object to improve the strength of this received signal. Such coils are termed "local coils" or "surface coils". The smaller area of the local coil permits it to accurately focus on NMR signal from the region of interest. Further, such local coils may be of higher quality factor or "Q" than the RF transmitting coil increasing the selectivity of the local coil and the relative strength of the acquired NMR signal.

The smaller size of the local coil makes it important that the local coil be accurately positioned near the region of interest. For "whole volume" coils, employing two antenna loops to receive the NMR signal from a volume defined between the loops, accurate positioning of the coils is particularly important. For a whole volume neck coil, for example, the two antenna loops must be placed on opposite sides of the neck and yet generally opposed along a single axis. This may be accomplished by fitting the coils to the surface of a cylindrical form, the form parting along a plane intersecting the axis of the cylinder to form two halves. These halves may be clamped about the patient during the scan.

One problem with this method of mounting the coils is that the separation of the coils is fixed by the radius of the cylinder. Equally important, the joining of the two halves of the form creates a closed cage that may create a disquieting sense of confinement.

A major technical problem in NMR systems is "decoupling" the local coil from the RF excitation signal from the transmit coil during the application of the RF excitation signal. Such decoupling reduces the distortion of the excitation field by the local coil and prevents potential damage to the sensitive circuits connected to the local coil from possibly large induced voltages.

Inductive coupling between the excitation field and the local coil may focus the deposition of the RF energy on a reduced volume the imaged object. In the case of the medical imaging of a patient, such focused energy may cause burns. Energy coupled to the local coil itself may cause heating of that coil, producing indirect burns to the patient and damage to the local coil and its circuitry. The problem of distortion and inductive coupling is compounded by the typical high "Q" of the local coils.

One method of decoupling the local coil from the RF excitation field is through the use of one or more solid state switches positioned along the local coil which may be activated either by an external electrical signal (active decoupling) or by the RF excitation field itself (passive decoupling). These switches disable or detune the local coil. One such approach which shows generally the use of back-to-back diodes for passively decoupling a local coil is described in U.S. Pat. No. 4,725,779, issued Feb. 16, 1988 to Hyde et al., entitled: "NMR Local Coil with Improved Decoupling" and hereby incorporated by reference. In this reference, back-to-back diodes, in the presence of the large induced voltages from the transmit coil, short together two adjacent antenna coils having counter rotating currents thus decoupling the antenna coils from the RF excitation field and reducing the inductive coupling to the local coil. The advantage of passive decoupling is the elimination of the need for additional wires and signals to control the decoupling device and hence the simplification of the coil.

SUMMARY OF THE INVENTION

The present invention provides an improved local coil for receiving NMR signals from the vicinity of a patient's neck. A base supports the supine patient's neck and head along a medial axis and a posterior saddle coil fits beneath the patient's head and neck. The posterior coil has a first and second arcuate end segment joined by a first and second loop. The arcuate end segments are attached to the base and the loops extend upward from the base so as to receive the patient's neck. A similar anterior saddle coil receives the patient's neck in substantial opposition to the first saddle coil when the anterior saddle coil is in the closed position.

The anterior saddle coil may open on a hinge which has a hinge axis crossing the medial axis and which is attached to the base by means of an extension tower extending upward from the base. The extension tower may include a sliding carriage for adjusting the hinge and hence the anterior coil toward and away from the base and posterior coil. The sliding carriage may be moved by means of a rack and pinion It is thus one object of the invention to provide a coil that reduces the patient's sense of being "closed in". The open construction of the anterior coil gives the coil a lightweight appearance as does the extension tower which provides the sole support for the anterior coil. The single point hinging of the anterior coil on the extension tower also improves the patient's sense of being unrestrained.

It is another object of the invention to proved an improved method of positioning the anterior coil and posterior coil with respect to the patient. The tipped axis of the hinge increases the entry area of the coil when the anterior coil is in the open position to conform to the swept volume of the patient's head and neck when the patient lies back against the base and posterior coil. The sliding carriage on the extension tower permits the height of anterior coil to be adjusted closely to the neck for improved sensitivity but preserves the relative position of the anterior and posterior coils along a constant coil axis. A rack and pinion allows this adjustment to be performed quickly and easily with one hand.

An improved passive decoupling method for such local coils is also taught in which the coil is effectively broken by the insertion of a high impedance network into the coil loop ("pole insertion") Specifically, a capacitor is connected across the terminals of the antenna coil for tuning the antenna coil to the resonant frequency. A non-linear conductor with a conducting and non-conducting state and having an intrinsic capacitance in the non-conducting state is placed in series with an inductor and the series combination is connected across the capacitor so as to form, in combination, a high impedance network. The value of the capacitor, the inductor and the intrinsic capacitance of the non-linear conducting element are selected to maximize the inpedance across the network, at the resonant frequency, and the capacitance and intrinsic inductance of the antenna loop are chosen so that the magnitude of their impedances are substantially equal at the resonant frequency.

It is thus one object of the invention to provide an improved method of decoupling a local coil by pole insertion. It has been discovered that the capacitance of the non-linear element, typically back-to-back diodes, has a significant effect on the selection of the proper values for the other network components. In particular the intrinsic capacitance of the network must greater than four times the intrinsic capacitance for optimum decoupling.

DETAILED DESCRIPTION OF THE PREFERRED EMBODIMENT

Figure 1:
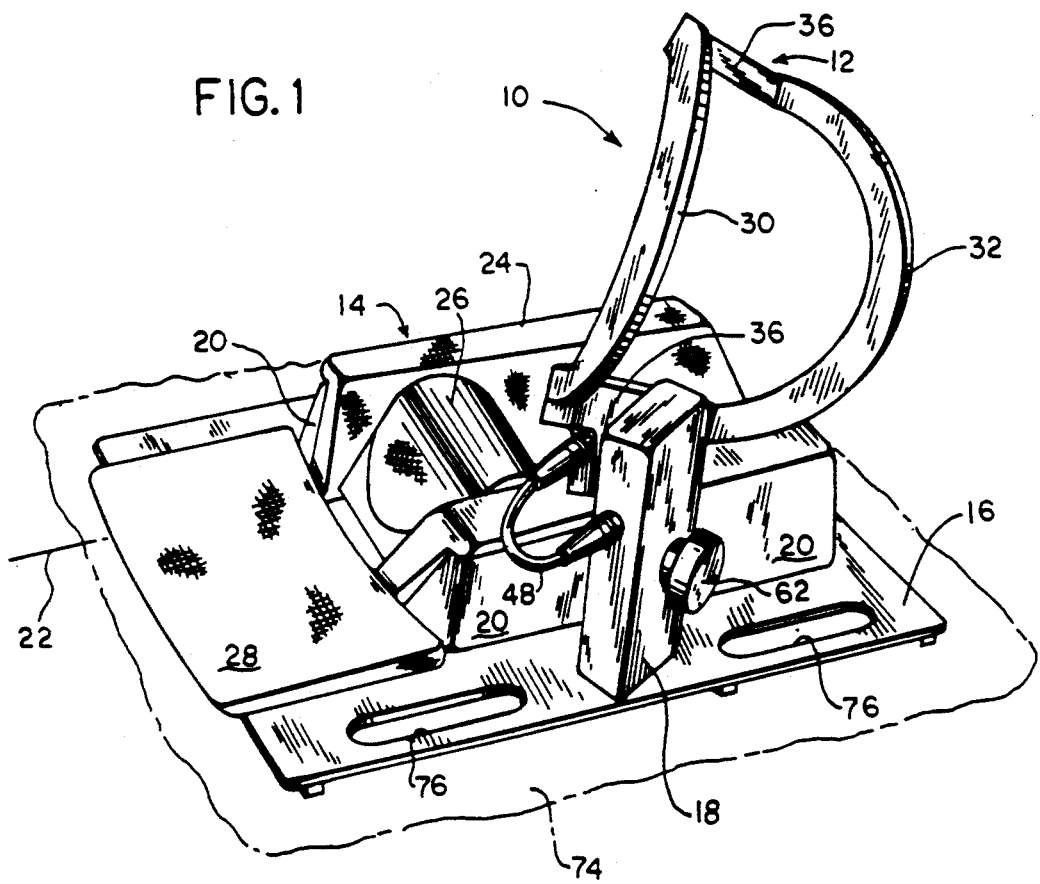
FIG. 1 is a perspective view of the local coil of the present invention showing the posterior and anterior paddle in the open position.

Referring to FIG. 1, the neck coil 10 of the present invention includes opposed anterior and posterior coils 12 and 14. The posterior coil 14 is supported by a generally horizontal, planar base 16 whereas the anterior coil 12 is held away from the base 16 by an extension tower 18 projecting perpendicularly upward from the horizontal surface of the base 16.

Figure 2:
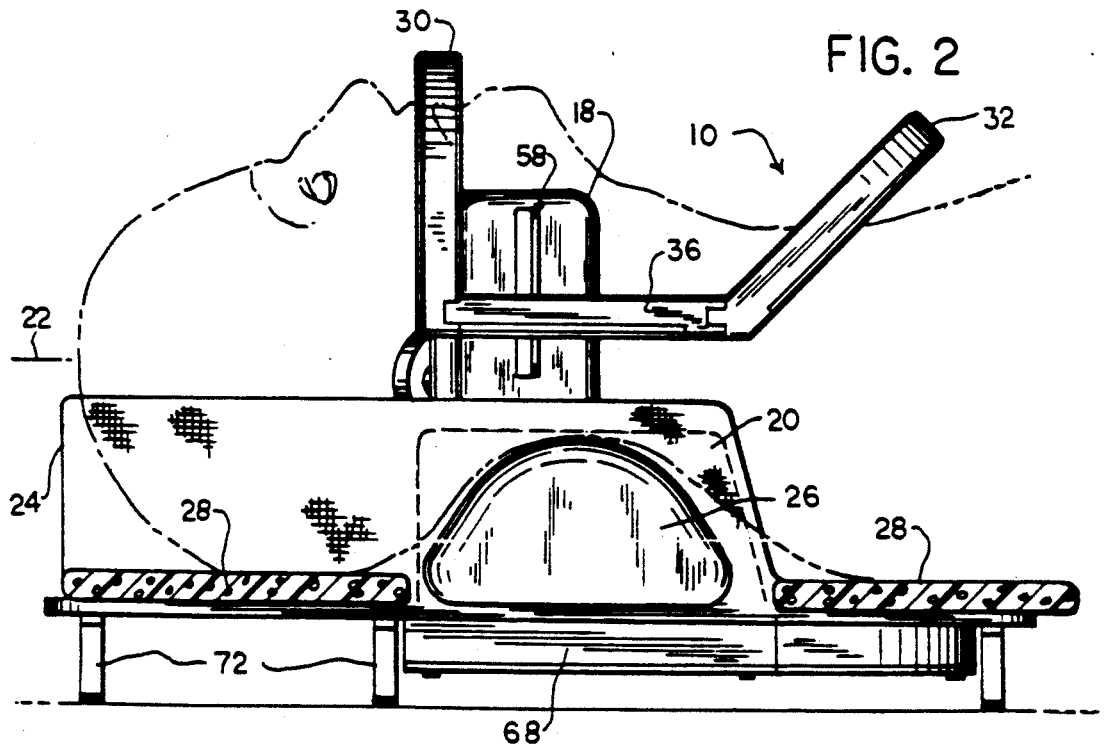
FIG. 2 is an elevation in cross-section along a midsagittal plane showing the positioning of the local coil of FIG. 1 on a patient.

Referring also to FIG. 2, when the local coil 10 is in use, the patient's head rests back against the upper surface of the base 16 with the patient's frontal plane generally parallel to the surface of the base 16. Left and right medially extending wedges 20 rise from the upper surface of the base 16. The wedges are symmetrically opposed about the medial axis 22 to support and position a trough shaped cushion 24 that cradles either side of the patient's neck and head when the patient is positioned in the coil 10. Held within the trough is a transverse hemicylindrical foam pad which supports the back of the patient's neck and tips the patient's head to face substantially upward on the base 16. Flat foam cushions 28 are positioned against the base 16 above and below the hemi-cylindrical cushion 26 along the medial axis 22, to support the back of the patient's head and shoulders.

The anterior antenna coil 12 includes an arcuate nose arch 30 and chest arch 32 joined to each other at the arch ends by substantially straight left and right sidebar 34 and 36 which form a saddle shaped guide. The left sidebar 34 is attached to and may hinge about the extension tower 18, as will be described, so as to move the anterior antenna coil 12 into an open or closed position. In the closed position, the left and right side bars 34 and 36 are parallel to the upper surface of the base 16 and positioned above the left and right wedges 20. In the closed position, the nose arch 30 extends downward around the patient's face in a transverse plane, and the chest arch 32 extends downward around the patient's lower neck in a plane angled between the transverse and frontal planes.

Figure 3:
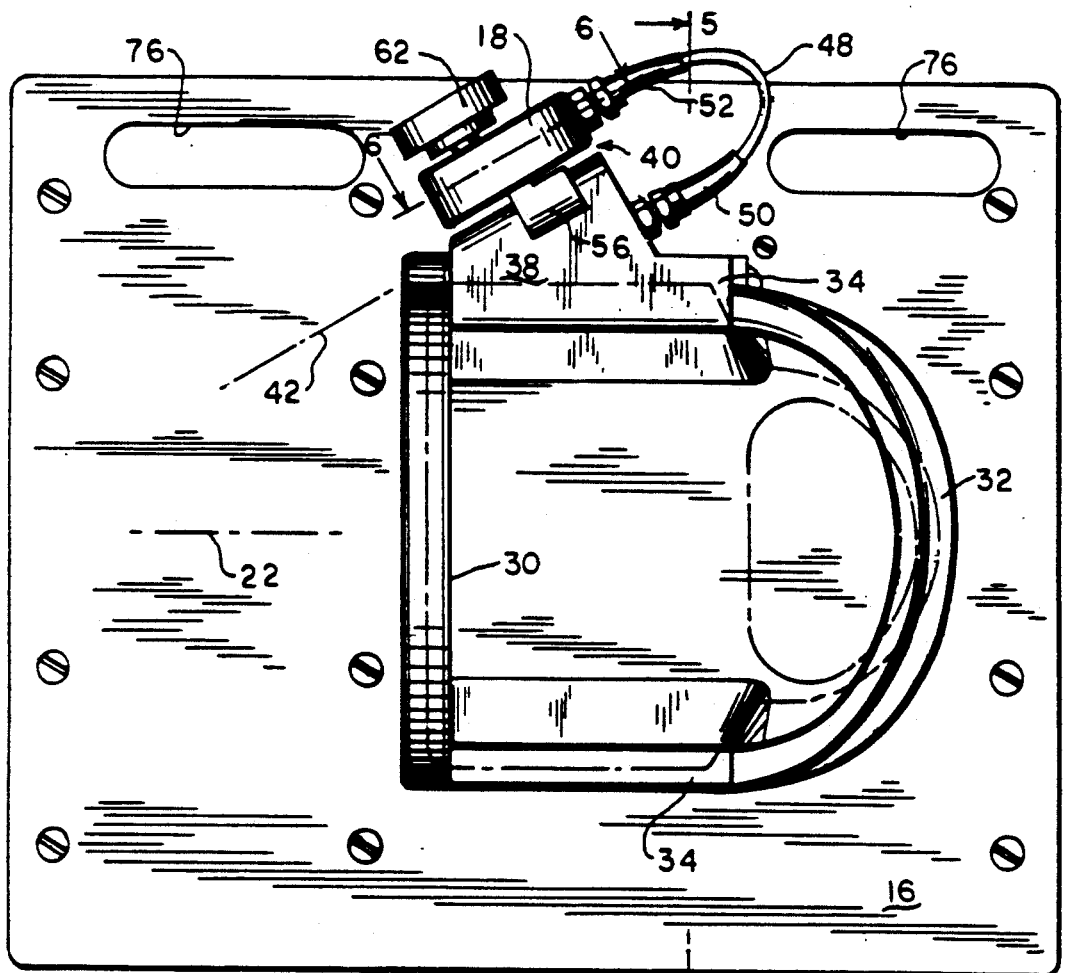
FIG. 3 is a plan view of the local coil of FIG. 1 showing the anterior and posterior coils in the closed position.

Referring to FIG. 3, the left sidebar 36 of the anterior antenna coil 12 includes an angled support 38 which forms one half of a hinge 40 having a hinge axis 42 parallel to the base 16 but tipped 30° with respect to the medial axis 22 so as to cross over the medial axis 22 superior to the patient's neck. This tipping of the hinge axis 42 retracts the chest arch 32 away from the point of patient entry when the anterior coil 12 is moved to the open position, thus improving the access for the patient who normally lays back against the base 16 and whose head enters the coil at a relatively steep angle. The above structural components are fabricated from a non-magnetic, non-conductive, polymeric material to reduce their interaction with the magnetic and electrical fields of the MRI equipment.

Figure 4:
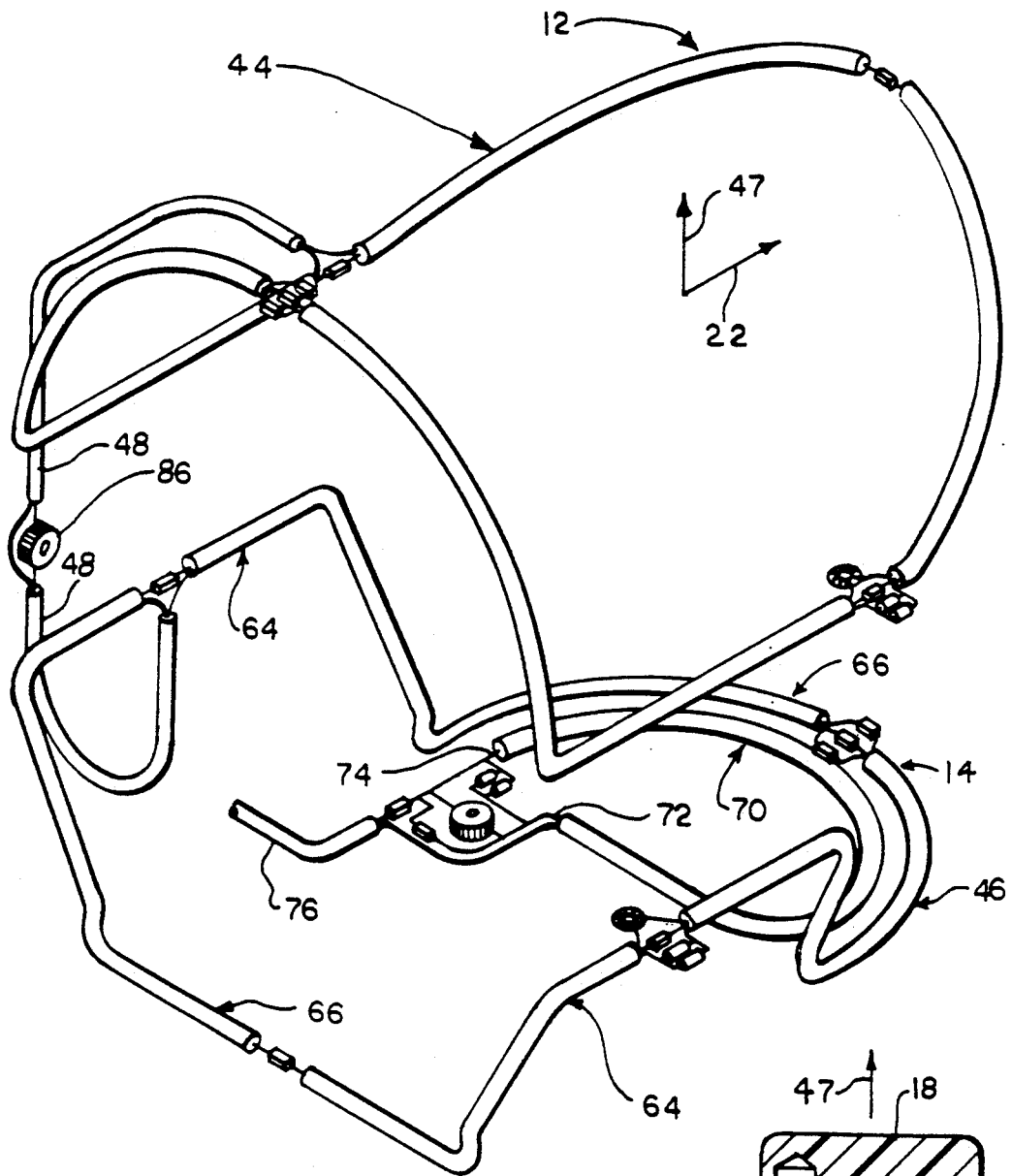
FIG. 4 is a perspective view of the anterior and posterior antenna loops in the closed position with the supporting structure removed for clarity.

Referring to FIG. 4, the anterior and posterior antenna coils 12 and 14 respectively carry an anterior and posterior antenna loop 44 and 46 formed of a length of copper tubing. In the closed position, the anterior and posterior antenna loops 44 and 46 form two loops of a Helmholtz solenoid having a solenoid axis 47 normal to the surface of the base 16 for detecting a vertically oriented RF field. The anterior and posterior antenna loops 44 and 46 are connected together to form a resonant structure by means of cable 48 as will be described further below.

Referring to FIGS. 1 and 4, the anterior antenna loop 44 is supported by the nose arch 30, the side bars 34 and 36, and the chest arch 32 and conforms to the frame so created. Cable 48 attaches to the anterior antenna loop 44 at the left sidebar 34 and exits through a hole drilled in the angle bracket 38 (shown in FIG. 3). A strain relief 50 guides the cable 48 in a loop to provide room for flexure of the cable 48, with opening and closing of the anterior antenna coil 12 and with vertical movement of the hinge 40, as will be described below. The cable 48 is then received by a second strain relief 52 in the vertical wall of the extension tower 18.

Figure 6:
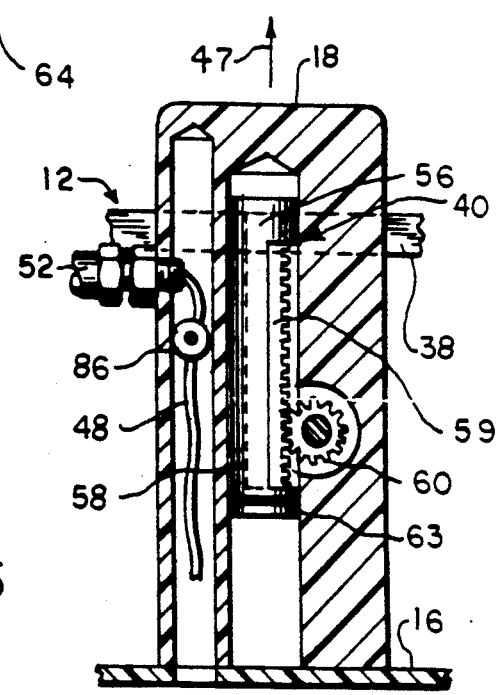
FIG. 6 is a cross sectional view of the extension column supporting the anterior coil taken along line 6—6 of FIG. 3.

Referring to FIGS. 3 and 6, the extension tower 18 incorporates a sliding carriage 56 fitting within a vertical slot 58 (visible in FIG. 2) on a face toward the anterior antenna coil 12. The sliding carriage 56 forms the second half of the hinge 40. The sliding carriage 56 is supported against rotation by the walls of the slot 58 and may be adjusted toward and away from the base 16 along the slot 58. Thus the height of the anterior antenna coil 12 above the patient's head may be adjusted, when the anterior antenna coil 12 is in the closed position. The slot 58 extends parallel to the solenoid axis 47 to preserve the orientation of the anterior and posterior antenna loops 44 and 46 along that axis 47 with motion of the carriage 56.

The sliding carriage 56 is attached to a cylindrical rack 59 contained in the extension tower 18 which is engaged by a pinion gear 60 attached to a knob 62 which protrudes from a face of the extension tower 18 opposite to that through which the sliding carriage 56 extends. A rubber O-ring 63 fits on the cylindrical end of the rack 59 and rubs against the channel through which the rack 59 slides to prevent slipping of the rack 59 after it has been positioned by the pinion 60 and knob 62. The height of the anterior coil 12 may be adjusted with one hand by turning the knob 62 appropriately.

The cable 48 from the anterior antenna coil 12 passes through the strain relief 52 into a second channel in the extension tower 18. The extension tower 18 is attached to the base 16 and the cable 48 passes through a hole in the base 16 at the point of attachment to connect to the posterior antenna loop 46.

Figure 5:
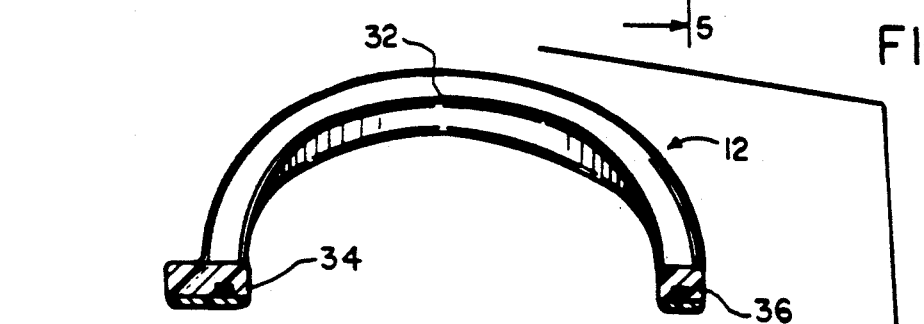
FIG. 5 is a cross-sectional view of the local coil along line 5—5 of FIG. 3.
Figure 5:
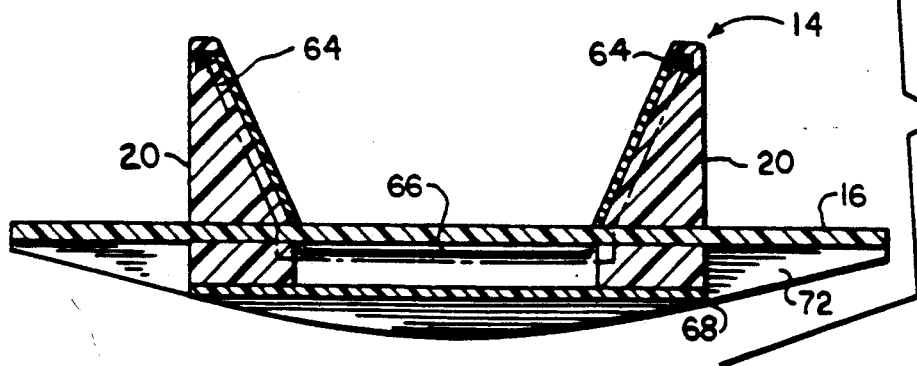

Referring to FIGS. 4 and 5, the posterior antenna loop 46 includes two arcuate loops 64 which rise on either side of the patient's neck when the patient is in position on the coil 10. These loops 64 fit into channels in the left and right wedges 20. The left and right loops 64 are connected by upper and lower end segments 66 substantially parallel to the plane of the base 16 and contained beneath the base 16 in a protective housing 68. A pickup loop 70 nests within the upper such segment 66 to provide inductive coupling to the posterior antenna loop 46 as will be described.

The base 16 has on its lower surface a number of downwardly extending arc shaped ribs 72 that fit against the concave upper surface of the MRI table 74 (shown in FIG. 1) to stiffen the base 16 and to provide additional support for the base 16 against the table 74. Also shown in FIG. 1, the base 16 includes cut out hand grips 76 which permit it to be readily removed from the table 74.

Figure 7:
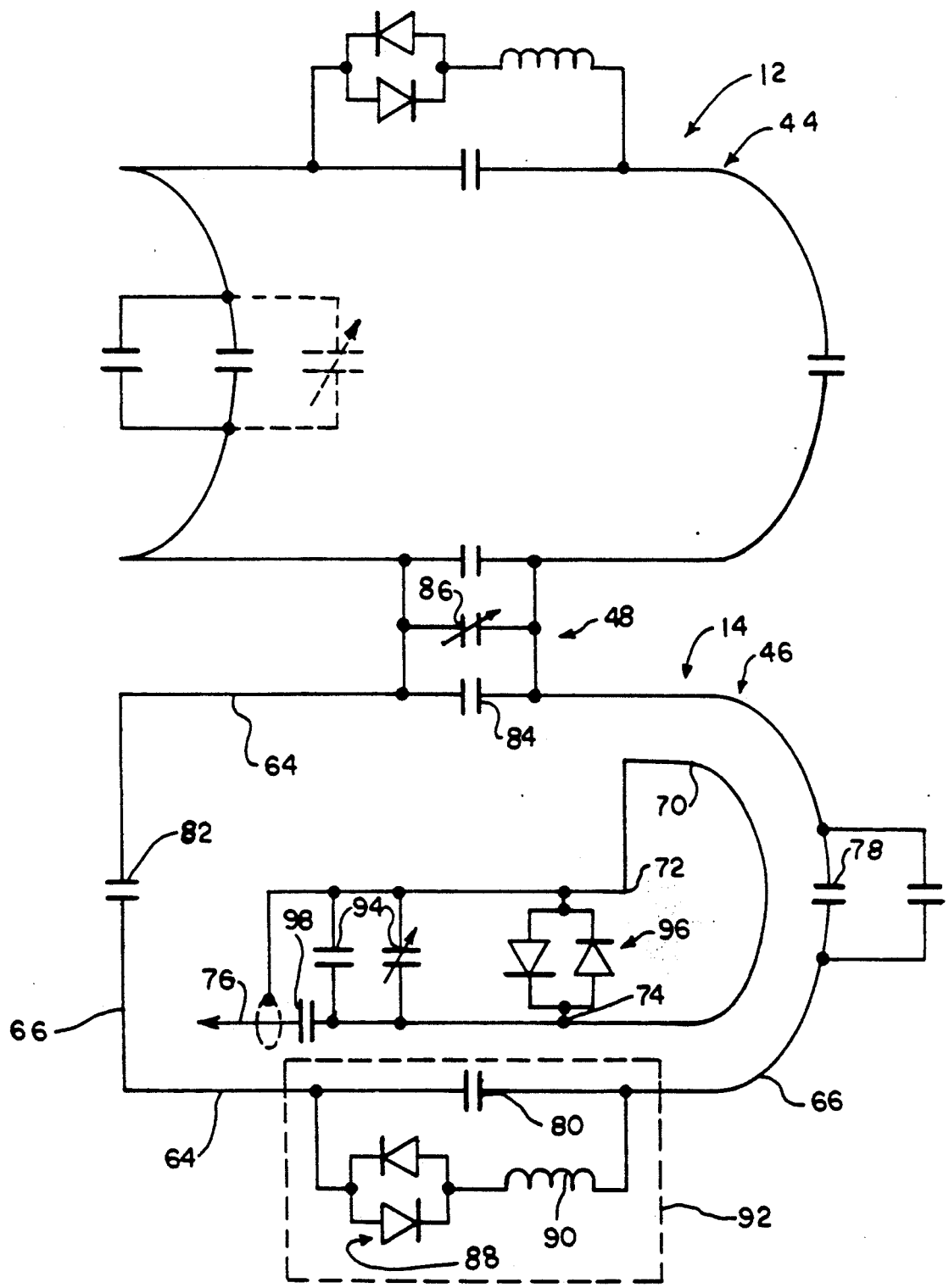
FIG. 7 is a schematic or the anterior and posterior coils and their associated circuitry.

Referring to FIGS. 4 and 7, the posterior and anterior antenna loops 44 and 46, as mentioned, are constructed of saddle shaped lengths of copper tubing. The pickup loop 70 is formed from a half circle of copper wire placed within the circumference of the posterior antenna loop 46 so as to inductively couple to the posterior antenna loop 46. The pickup loop 70 is opened at one point along its circumference near the extension tower 18 to form two terminals 72 and 74 which are attached by means of cable 76 to the NMR equipment (not shown). As has been described, cable 48 is connected between the anterior and posterior antenna loops 44 and 46. Both cable 76 and 48 are standard 50 $\Omega$ coaxial cable.

The anterior antenna loop 44 is electrically identical to the posterior antenna loop 46, except for the absence of a pickup loop 70 and its associated circuitry, and for this reason, only the circuitry of the posterior antenna loop 46 will be described in detail. The absence of the pickup loop 70 from the anterior antenna loop 44 allows the anterior antenna coil 12 to have an open construction to reduce patient apprehension or claustrophobia as has been discussed.

The posterior antenna loop 46 is cut at four points spaced approximately equal distances along the loop. The cuts are bridged by capacitors 78 through 84. These cut point will be termed interfaces and the capacitors 78 through 84 across the cut points will be termed interface capacitors.

The interface at capacitor 84 along the left lateral edges of the base 16 near the extension tower 18 receives the cable 48 joining the anterior and posterior antenna loops 44 and 46. The shield and center conductor of the cable 48 are connected on either side of the interface capacitor 84 and provide a DC connection to a corresponding interface capacitance on the anterior antenna loop 44 such that the current through the anterior and posterior coils 44 and 46 flows in the same direction at resonance. A tuning capacitor 86, positioned in the extension tower 18 midway along the cable 48 connects the shield and inner conductor of cable 48 and serves to tune both the anterior and posterior antenna loops 44 and 46, in tandem, to the resonant frequency. Differences between the relative tunings of the anterior and posterior antenna loops 44 and 46 are removed by a trimmer capacitor connected across one of the interface capacitors of the anterior antenna loop as will be understood to those of ordinary skill in the art.

Short leads connect to the posterior antenna loop 46 on each side of the interface associated with interface capacitor 80, opposed to the interface capacitor 84, at either end of series connected back-to-back diodes 88 and inductor 90 which together with capacitor 80 comprise the passive decoupling network 92.

As is understood in the art, the back-to-back diodes 88, are constructed of two diodes having the anode of the first connected to the cathode of the second and the cathode of the first connected to the anode of the second to form a non-linear conductor which has a very high resistance for voltages below a forward bias voltage (approximately 0.7 volts for silicon diodes) and a low resistance for voltages above this threshold. When the voltage across the interface capacitor 80 in the posterior antenna loop 46 is below the forward bias threshold of the back-to-back diodes, as will be the case when NMR signal is being detected, the inductor 90 will be connected in series with the posterior antenna loop 46.

As mentioned, the purpose of the passive decoupling network is to decouple the posterior antenna coil 46 from the high strength RF excitation field but to couple the posterior antenna coil 46 to the low strength NMR signal both at the same resonant frequency. This decoupling is accomplished by the above described switching of inductor 90 into the posterior antenna loop 46 in response to high loop currents caused by the RF excitation field. The inductor 90 together with capacitor 80 form a "pole" or band reject network tuned to the resonant frequency and effectively blocks current flow at that resonant frequency and decouples the posterior antenna loop 46.

As described, the switching of the inductor 90 into and out of the posterior antenna loop 46 is accomplished by the back-to-back diodes which conduct only in response to the higher voltages induced by the RF excitation field and are essentially non-conductive at the lower voltages induced by the NMR signal. Each of these states: 1) conducting during RF excitation, and 2) not conducting during NMR signal reception changes the effective composition of network 92 and thus the characteristics of the posterior antenna loop circuit as is shown in simplified schematics of FIGS. 8(a) and (b).

Figure 8A:
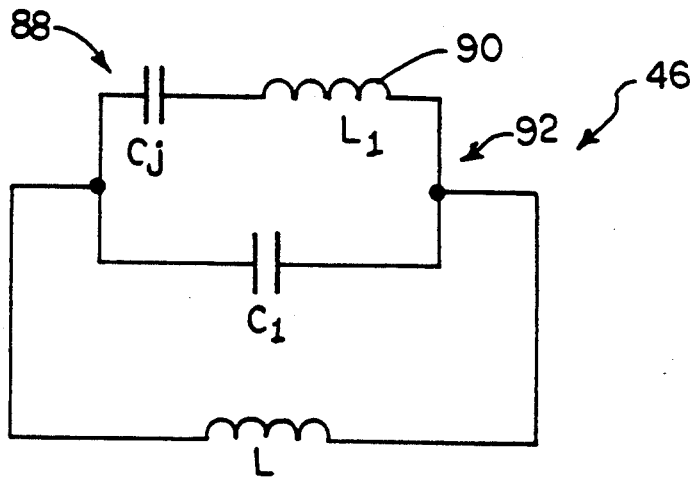
FIGS. 8(a) and 8(b) are simplified versions of the schematic of FIG. 7 during the RF transmit mode and the NMR receive mode respectively.

Referring to FIGS. 7 and 8(a), during the reception of the NMR signal, the back-to-back diodes 88 are non-conducting. Rather than completely disconnecting the pole-forming inductor, however, as might be anticipated by a simple model of such diodes 88, it has been determined that they exhibit a significant junction capacitance represented by $C_j$. Hence the passive network 92 of FIG. 8(a) consists of an effective capacitance of value $C_j$ in series with the inductor 90 of value $L_1$, with that series combination connected across capacitor 80 having value $C_1$.

The entire network 92 is connected across the rest of posterior antenna coil 46 having a net inductance value of L. While each antenna loop 44 and 46 also includes a number of interface capacitors and the impedance of the other antenna loop 46 or 44 coupled inductively and through cable 48, the impedance as seen at the interface of capacitor 80 will be inductive at the resonant frequency as a result of the tuning of the local coil 10 to that resonant frequency. Specifically, in the case of the posterior antenna loop 46, this tuning results in approximate equivalence between the impedances of all four interface capacitances: 78, 80, 82, 84 and the distributed inductance of the posterior antenna loop 46. Hence, the reactance of the posterior antenna loop 46 seen across any one of its interfaces, includes only three of the interface capacitors, and will appear inductive.

Figure 8B:
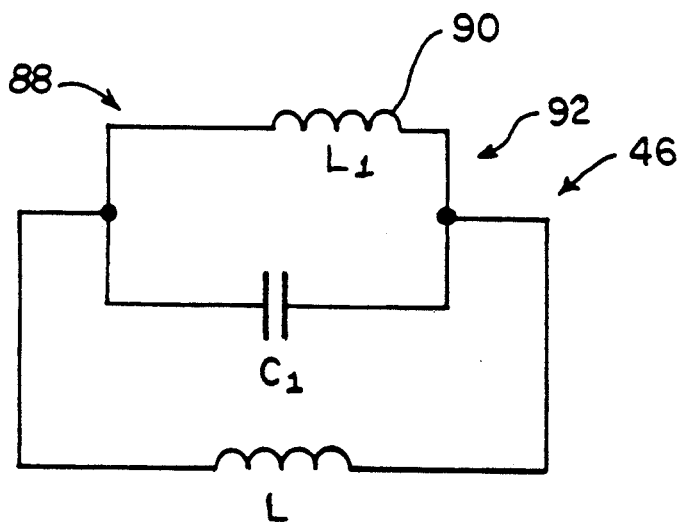

Referring to FIGS. 7 and 8(b), during the transmission of the RF excitation signal, the back-to-back diodes 88 conduct and hence shunt the junction capacitance $C_j$ reducing the network 92 to a simple parallel resonant circuit comprised of capacitor 80 ($C_1$) and inductor 90 ($L_1$). Ideally, the values of these two components are selected to create a filter having a pole at the resonant frequency.

Recognizing the significance of the capacitance $C_j$ of the back-to-back diodes 88, the relative values of $C_j$, $C_1$, $L_1$ and L may be determined. The following analysis is identical for the anterior and posterior antenna loops.

As stated above, during the receiving of the NMR signal, the back-to-back diodes 88 are in their high impedance state and hence the circuit associated with each coil may be simplified to the diagram as shown in FIG. 8(a).

The impedance of $C_j$, $C_1$, and $L_1$ is capacitive in character at the frequency of the NMR signal, (i.e. near the resonant frequency). In this case, the entire network 92 will have a purely capacitive impedance with magnitude defined as $X_C$. Also, for the purpose of this analysis, the resistance of the various elements of the network 92 and posterior antenna loop 46 are neglected. It will be understood to those of ordinary skill in the art that such small resistances of high quality components will have negligible effect on the pole frequency of the network 92 or the resonant frequency of the posterior antenna coil 46 which together define the values of $C_j$, $C_1$ and $L_1$.

Given the above assumptions, the impedance of the network 92 when the local coil 10 is receiving and the back-to-back diodes 88 are non-conducting is:

$$-jX_C = \frac{-jX_{C1}(jX_{L1} - jX_{Cj})}{-jX_{C1} - jX_{Cj} + jX_{L1}} \quad (1)$$

where $-X_C$ is the impedance of the network 92 and $X_{C1}$, $X_{Cj}$, and $X_{L1}$ are the impedances of diodes 88, the capacitor 80 and inductor 90 respectively, and where $j = \sqrt{-1}$ per convention.

As is understood in the art, the posterior antenna loop 46 is tuned to the resonant frequency so as to be maximally sensitive to the NMR signal. It is understood that this tuning requires that $|-jX_C| = |jX_L|$ where $X_L$ is the inductance of the posterior antenna loop 46.

As mentioned above, when the posterior antenna loop 46 is in the presence of an exciting RF field, the back-to-back diodes 88 conduct, effectively shorting the capacitance $C_j$ and producing the equivalent circuit of FIG. 8(b). For optimal decoupling by pole insertion, the values $L_1$ and $C_1$ must be selected to form a parallel resonant circuit at the excitation or resonant frequency to block current flow through the posterior antenna loop 46. Hence:

$$|X_{C1}| = |X_{L1}| \quad (2)$$

Substituting equation (2) into equation (1) and simplifying yields $$-X_C = \frac{X_{C1}(X_{Cj} - X_{C1})}{X_{Cj}} \quad (3)$$

or

-continued $$x_{C_1}^2 - x_{C_1}x_{C_j} + x_C x_{C_j} = 0 \quad (4)$$

then by definition $$\left(\frac{1}{\omega C_1}\right)^2 - \frac{1}{\omega^2 C_1 C_j} + \frac{1}{\omega^2 C C_j} = 0 \quad (5)$$

or $$C_1^2 - C_1 C + C C_j = 0 \quad (6)$$

and therefore:

$$C_1 = \frac{C \pm \sqrt{C^2 - 4CC_j}}{2} \quad (7)$$

Of course capacitance values $C$, $C_1$, and $C_j$ must be positive and real and hence equation (7) demands $$C > 4C_j \quad (8)$$

For a given junction capacitance $C_j$ of the back-to-back diodes 88, this condition may be met by changing $C_1$ and correspondingly changing the value of the inductance of the posterior antenna coil 46 as is appropriate. Increasing the inductance of the posterior antenna coil 46, however, is realized by a change in coil geometry or size and hence either reduces the Q of the local coil 10, or degrades the filling factor or sensitivity of the coil to signal from the specified patient anatomy. Therefore, it is preferable to find diodes 88 with the smallest values of $C_j$ possible and with the appropriate switching speeds.

Determination of the values of $C_1$, $L_1$, and $L$, as derived above, provides superior decoupling and tuning for the neck coil 10.

It should be noted that in general, the value of capacitor $C_1$ is fixed by the inductance of the posterior antenna loop, that inductive value being a function of the geometry of the coil. Further, the value $C_j$ is determined by the manufacture of the diodes 88 and fixed, within a range, for a given diode type. Although the inductance $L_1$ is tunable, it cannot compensate for incorrect values of $C_1$ or $C_j$ as is apparent from equation 7. Therefore, as a practical matter, it is necessary to calculate the proper values of the network 92 components prior to construction of the coil 10—they cannot be "tuned" once in place. For this reason, it is unlikely that the correct values would be arrived at accidently or by trial and error.

The received NMR signal is transmitted to the MRI apparatus by cable 76 which is connected to the pickup loop 70. A parallel capacitance 94, connected across cable 76 through a series capacitance 98, between one wire of the cable and the parallel capacitance 94, provides impedance matching of the pickup loop 70 to the 50 Ω cable. A second pair of back-to-back diodes 96 shunt the capacitance 94 as well as short the pick-up loop 70. Capacitor 98 also prevents DC bias, which may be present on cable 76, from inadvertently switching diodes 96. The diodes 96 serve to detune the pickup coil so as to reduce direct pickup of the RF excitation signal by the pickup coil despite decoupling of the anterior and posterior coils 12 and 14.

The above description has been that of a preferred embodiment of the present invention. It will occur to those who practice the art that many modifications may be made without departing from the spirit and scope of the invention. For example, the passive decoupling network described may be applied to other types of local coils which need not be whole volume coils. In order to apprise the public of the various embodiments that may fall within the scope of the invention, the following claims are made.

We claim:

1. A local coil for use in receiving NMR signals from the vicinity of a patient's neck, the coil comprising:
   a base for supporting the patient's neck and head along a medial axis;
   a first saddle coil means having a first and second arcuate end segments joined by a first and second loop, the arcuate end segments attached to the base and the loops extending outward from the base so as to receive the patient's neck therebetween;
   a hinge having a first and second side and including a hinge axis crossing the medial axis, the first side affixed to an extension tower attached to and extending outward from the base; and
   a second saddle coil means having a first and second arcuate end segment joined by a first and second loop, the first loop attached to the second side of the hinge so as swing between an open and closed position and wherein the first and second loop of the second coil extend inward toward the base to receive the patient's neck in substantial opposition to the first saddle coil when the second saddle coil is in the closed position.

2. The local coil of claim 1 wherein the extension tower includes a carriage for sliding inward and outward along the extension tower and the second side of the hinge is attached to the carriage.

3. The local coil of claim 2 wherein the position of the carriage is adjusted by means of a rack and pinion gear.

* * * * *